US009221684B2

(12) United States Patent
De Volder

(10) Patent No.: US 9,221,684 B2
(45) Date of Patent: Dec. 29, 2015

(54) HIERARCHICAL CARBON NANO AND MICRO STRUCTURES

(75) Inventor: Michael De Volder, Ghent (BE)

(73) Assignees: IMEC, Leuven (BE); Katholieke Universiteit Leuven, KU Leuven R&D, Leuven (BE)

( * ) Notice: Subject to any disclaimer, the term of this patent is extended or adjusted under 35 U.S.C. 154(b) by 0 days.

(21) Appl. No.: 14/114,819

(22) PCT Filed: May 3, 2012

(86) PCT No.: PCT/EP2012/058066
§ 371 (c)(1),
(2), (4) Date: Oct. 30, 2013

(87) PCT Pub. No.: WO2012/150278
PCT Pub. Date: Nov. 8, 2012

(65) Prior Publication Data
US 2014/0079921 A1 Mar. 20, 2014

Related U.S. Application Data

(60) Provisional application No. 61/482,109, filed on May 3, 2011.

(51) Int. Cl.
B44C 1/22 (2006.01)
C01B 31/02 (2006.01)
B82Y 30/00 (2011.01)
B82Y 40/00 (2011.01)
(Continued)

(52) U.S. Cl.
CPC ......... C01B 31/0206 (2013.01); B81C 1/00031 (2013.01); B82Y 30/00 (2013.01); B82Y 40/00 (2013.01); C01B 31/00 (2013.01); C01B 31/0226 (2013.01); C01B 31/0293 (2013.01); Y10T 428/2481 (2015.01); Y10T 428/2918 (2015.01)

(58) Field of Classification Search
CPC .... C01B 31/00; C01B 31/0206; B82Y 30/00; B82Y 40/00; G03F 7/40
USPC ............... 216/11, 47, 49, 51, 67; 977/742
See application file for complete search history.

(56) References Cited

U.S. PATENT DOCUMENTS 7,534,470 B2    5/2009  Madou
2006/0068107 A1* 3/2006  Madou et al. ............. 427/249.1
(Continued)

OTHER PUBLICATIONS

Internet Archive, Way Back Machine; Wikipedia The Free Encyclopedia , "SU-8 photoresist", https://web.archive.org/web/20091108093738/http://en.wikipedia.org/wiki/SU-8_photoresist ; Nov. 8, 2009, 1 page.*

(Continued)

Primary Examiner — Binh X Tran
(74) Attorney, Agent, or Firm — McDonnell Boehnen Hulbert & Berghoff LLP

(57) ABSTRACT

Disclosed are methods for fabricating pyrolysed carbon nanostructures. An example method includes providing a substrate, depositing a polymeric material, subjecting the polymeric material to a plasma etching process to form polymeric nanostructures, and pyrolysing the polymeric nanostructures to form carbon nanostructures. The polymeric material comprises either compounds with different plasma etch rates or compounds that can mask a plasma etching process. The plasma etching process may be an oxygen plasma etching process.

18 Claims, 11 Drawing Sheets

(51) Int. Cl.
B81C 1/00 (2006.01)
C01B 31/00 (2006.01)

(56) References Cited

U.S. PATENT DOCUMENTS

| | | | |
|---|---|---|---|
| 2006/0157771 A1* | 7/2006 | Choi et al. | 257/306 |
| 2006/0223947 A1* | 10/2006 | Olesik et al. | 525/328.1 |
| 2007/0127164 A1* | 6/2007 | Ofek et al. | 360/324 |
| 2008/0176138 A1* | 7/2008 | Park et al. | 429/213 |
| 2010/0051446 A1* | 3/2010 | Wang et al. | 204/192.15 |

OTHER PUBLICATIONS

PCT International Search Report, PCT International Application No. PCT/EP2012/058066 dated Oct. 23, 2012.

Tang, Y.H. et al., "Synthesis and Characterization of Amorphous Carbon Nanowires", Applied Physics Letters, vol. 75, No. 19, Nov. 8, 1999, pp. 2921-2923.

Walther, Ferdinand et al., "Stability of the Hydrophilic Behavior of Oxygen Plasma Activated SU-8", Journal of Micromechanics and Microengineering, vol. 17, Feb. 9, 2007, pp. 524-531.

Singh, Amit et al., "Pyrolysis of Negative Photoresists to Fabricate Carbon Structures for Microelectromechnical Systems and Electrochemical Applications", Journal of the Electrochemical Society, vol. 149, No. 3, Jan. 29, 2002, pp. E78-E83.

Tsougeni, K. et al., "Mechanisms of Oxygen Plasma Nanotexturing of Organic Polymer Surfaces: From Stable Super Hydrophilic to Super Hydrophobic Surfaces", Langmuir, vol. 25, No. 19, Jun. 8, 2009, pp. 11748-11759.

Schueller, Olivier J.A. et al., "Fabrication of Glassy Carbon Microstructures by Soft Lithography", Sensors and Actuators A, vol. 72, 1999, pp. 125-139.

Sharma, Chandra S. et al., "Multiscale Carbon Structures Fabricated by Direct Micropatterning of Electrospun Mats of SU-8 Photoresist Nanofibers", Langmuir, vol. 26, No. 4, Jan. 13, 2010, pp. 2218-2222.

Martinez-Duarte, Rodrigo et al., "The Integration of 3D Carbon-Electrode Dielectrophoresis on a CD-Like Centrifugal Microfluidic Platform", Lab Chip, vol. 10, Feb. 4, 2010, pp. 1030-1043.

Soleymani, Leyla et al., "Programming the Detection Limits of Biosensors Through Controlled Nanostructuring", Nature Nanotechnology, vol. 4, Dec. 2009, pp. 844-848.

Sun, Bin et al., "Covalent Photochemical Functionalization of Amorphous Carbon Thin Films for Integrated Real-Time Biosensing", Langmuir, Oct. 14, 2006, pp. 9598-9605.

Brooksby, Paula A. et al., "Nanoscale Patterning of Flat Carbon Surfaces by Scanning Probe Lithography and Electrochemistry", Langmuir, vol. 21, Jan. 27, 2005, pp. 1672-1675.

Teixidor, G. Turon et al., "Carbon Microelectromechnical Systems as a Substratum for Cell Growth", Biomedical Materials, vol. 3, Aug. 15, 2008, pp. 1-8.

Wang, Yun et al., "Fabrication and Characterization of Micro PEM Fuel Cells Using Pyrolyzed Carbon Current Collector Plates", Journal of Power Sources, vol. 195, Feb. 24, 2010, pp. 4796-4803.

Nguyen-Vu, T.D. Barbara et al., "Vertically Aligned Carbon Nanofiber Arrays: An Advance Toward Electrical-Neural Interfaces", Small, vol. 2, No. 1, 2006, pp. 89-94.

Schueller, Olivier J.A. et al., "Fabrication of Glassy Carbon Microstructures by Pyrolysis of Microfabricated Polymeric Precursors", Advanced Materials, vol. 9, No. 6, 1997, pp. 477-480.

Huang, Jen-Huang et al., "Rapid Fabrication of Bio-Inspired 3D Microfluidic Vascular Networks", Advanced Materials, vol. 21, 2009, pp. 3567-3571.

Boesel, Luciano F. et al., "Gecko-Inspired Surfaces: A Path to Strong and Reversible Dry Adhesives", Advanced Materails, vol. 22, 2010, pp. 2125-2137.

Wang, Chunlei et al., "A Novel Method for the Fabrication of High-Aspect Ratio C-MEMS Structures", Journal of Microelectromechanical Systems, vol. 14, No. 2, Apr. 2005, pp. 348-358.

Lee, Jung A. et al., "Fabrication and Characterization of Freestanding 3D Carbon Microstructures Using Multi-Exposures and Resist Pyrolysis", Journal of Micromechanics and Microengineering, vol. 18, Jan. 24, 2008, pp. 1-10.

Wang, Chunlei et al., "Local Chemical Vapor Deposition of Carbon Nanofibers from Photoresist", Carbon, vol. 44, 2006, pp. 3073-3077.

Soleymani, Leyla et al., "Nanostructuring of Patterned Microelectrodes to Enhance the Sensitivity of Electrochemical Nuclei Acids Detection", Angew. Chem. Int. Ed., vol. 48, 2009, pp. 8457-8460.

Gao, Huajian et al., "Mechanics of Hierarchical Adhesion Structures of Geckos", Mechanics of Materials, vol. 37, 2005, pp. 275-285.

Davis, Frank et al., "Single Gene Differentiation by DNA-Modified Carbon Electrodes Using an AC Impedimetric Approach", Analytical Chemistry, vol. 79, No. 3, Feb. 1, 2007, pp. 1153-1157.

Copic, Davor et al., "Fabrication of High-Aspect-Ratio Polymer Microstructures and Hierarchical Textures Using Carbon Nanotube Composite Master Molds", Lab on a Chip, vol. 11, 2011, pp. 1831-1837.

Du, Rongbing et al., "Fabrication and Characterization of Graphitic Carbon Nanostructures With Controllable Size, Shape, and Position", Small, vol. 5, No. 10, 2009, pp. 1162-1168.

\* cited by examiner

HIERARCHICAL CARBON NANO AND MICRO STRUCTURES

FIELD OF THE DISCLOSURE

The present disclosure relates to fabrication methods for pyrolysed carbon nanostructures, the obtained products and devices herewith and its related applications.

BACKGROUND OF THE DISCLOSURE

Nanostructured carbon emerged as one of the most promising nano materials of the last decades. Ranging from graphene sheets to fullerenes, nanotubes (CNTs) and diamond like coatings, various types of carbon structures have been developed, each with their own fascinating properties. Besides these well known allotropes, various other interesting types of carbon materials exist that are typically fabricated by pyrolysis of an organic polymer.

Amorphous carbon may be particularly interesting in applications requiring a wide electrochemical stability window, excellent bio-compatibility, and good thermal conductivity.

For these reasons, as well as its cost-effective fabrication, G. Whitesides, M. Madou and others [Schueller, O. J. A., Brittain, S. T. & Whitesides, G. M., Sensors and Actuators a-Physical 72, 125-139 (1999)] have pioneered the application of pyrolysed carbon in microsystems including heat exchangers, chemical probes, lab on a chip systems, biosensors, fuel cells, and it has been implanted over a million times in heart valves and orthopedic joints. Madou et al have studied the application of pyrolysed carbon in microsystems including lab on a chip systems with the integration of 3D carbon-electrode dielectrophoresis [Martinez-Duarte, R., Gorkin, R. A., Abi-Samra, K. & Madou, M. J. Lab on a Chip 10, 1030-1043].

Few methods are developed for the fabrication of amorphous carbon nanowires (CNWs), the most common probably being pyrolysis of electrospun polymers [Sharma, C. S., Sharma, A. & Madou, M., Langmuir 26, 2218-2222]. While this process is interesting for fabricating mats of randomly oriented nanowires, it does not facilitate the fabrication of high aspect ratio structures obtaining anisotropic properties. Further most of the existing fabrication methods for pyrolysed nanowires are not compatible with standard microfabrication techniques.

U.S. Pat. No. 7,534,470 discloses a method for nanotexturizing amorphous carbon using plasma treatment. While this process enables nanoscale roughening the surface, it does not permit the fabrication of nanowires (i.e. nanoscale solid rods made out of amorphous carbon). U.S. Pat. No. 7,534,470 also discloses making carbon nanotubes (i.e. nanoscale hollow tubes made out of SP2 hybridized carbon) on top of pyrolysed structures. This process enables to fabricate hierarchical carbon nanostructures, however this process involves extra fabrication steps, such as the deposition of a catalyst layer for the nanotube growth. This process leads to the formation of carbon nanotubes (a SP2 hybridized carbon lattice) and does not permit the formation of amorphous nanowires. Carbon nanotubes have different morphology, reactivity and functionality than amorphous nanowires.

SUMMARY OF THE DISCLOSURE

It is an aim of the present disclosure to provide a method for manufacturing carbon micro- or nanostructures. This aim is achieved according to the disclosure with a method comprising the steps of the first independent claim.

This method permits to obtain micro- or nanostructures such as vertically aligned nanowires via a limited number of steps.

In a first aspect, the present disclosure relates to a method for fabricating pyrolysed carbon nanostructures, the method comprising at least the following steps:
  providing a polymeric material comprising either:
    At least one compound with different etch rates, and/or at least one compound that can mask an etching process, and then
  subjecting said polymeric material to an etching process (such as exposure to a oxygen plasma) to form polymeric nanostructures, and then,
  pyrolysing said polymeric nanostructures to form pyrolysed carbon nanostructures.

In embodiments, said etch rate is preferably a plasma etch rate and more preferably an oxygen plasma etch rate. Also, said etching process is preferably a plasma etching process, more preferably an oxygen plasma etching process.

In an embodiment, the method may further comprise before the step of providing a polymeric material, a step of providing a substrate, and wherein said polymeric material is deposited on said substrate. Therefore, in an embodiment, the present disclosure relates to a method for fabricating pyrolysed carbon nanostructures, the method comprising at least following steps:
  providing a substrate, and then
  depositing a polymeric material comprising either compounds with different plasma etch rates, or compounds that can mask a plasma etching process, and then
  subjecting said polymeric material to a plasma etching process such as exposure to an oxygen comprising plasma to form polymeric nanostructures and then
  pyrolysing said polymeric nanostructures to form pyrolysed carbon nanostructures.

Similarly, the first aspect of the present disclosure also relates to a method for fabricating pyrolysed carbon nanostructures, the method comprises at least following steps:
  Providing a substrate, and then
  Depositing a polymeric material on said substrate, said polymeric material comprising either:
    At least one compound with different plasma etch rates, and/or
    at least one compound that can mask a plasma etching process, and then
  Subjecting said polymeric material to a plasma etching process such as exposure to an oxygen comprising plasma to form polymeric nanostructures and then
  Pyrolysing said polymeric nanostructures to form pyrolysed carbon nanostructures.

In an embodiment, said substrate comprises one or more electrodes and said polymeric nanostructures are formed on said one or more electrodes. This enables electrical integration.

Preferably, the polymeric material comprises at least one compound that can mask a plasma etching process. This compound can be comprised in the bulk (e.g. dispersed in the bulk) of the polymeric material or on its surface (e.g. dispersed on its surface).

In embodiments, the plasma etching time may be sufficient to form said nanostructures (e.g. nanowires). For instance, the plasma etching time may be adapted to the height desired for the nanostructures.

In embodiments, this etching time may be from 1 to 60 min, preferably from 5 to 60 min, more preferably from 10 to 60 min. This may however vary depending on the equipment.

In an embodiment, the plasma treatment may be confined to a certain region of said polymeric material by applying an additional masking step such as providing a hard mask onto the polymeric material prior to the step of subjecting said polymeric material to a plasma etching process. In other words, the plasma treatment may be confined to a certain region of said polymeric material by applying a masking step prior to the step of subjecting said polymeric material to a plasma etching process.

In an embodiment, the method of the first aspect may furthermore comprise after the step of providing a polymeric material and before the step of plasma etching, a step of patterning the polymeric material into a polymeric structure (e.g. microstructures such as pillars) by means of an additional patterning step such as a patterning step selected from lithographic patterning, moulding, casting and printing.

In an embodiment, the steps of depositing a polymeric material and patterning said polymeric material into a polymeric structure may be repeated in order to form an additional polymeric structure onto the existing polymeric structure and these steps are iterated as many times as required by the application.

In an embodiment, said at least one compound that can mask a plasma etching process may be a micro or nanoparticle, preferably a nanoparticle.

In an embodiment, said compounds that can mask an etching process (e.g. a plasma etching process) may be metallic, ceramic or other micro or nanoparticles such as Sb present in said polymeric material, and/or masking particles being co-deposited during the (plasma) etching process or any other deposition method.

In other words, said micro or nanoparticle may be selected form metallic and ceramic micro or nanoparticles such as Sb nanoparticles present in said polymeric material.

Also, said at least one compound that can mask a plasma etching process may be deposited during the plasma etching process or via any other deposition method. In this case, the compound is typically comprised on the polymer material (top) surface and is for instance sputtered from the oxygen plasma reactor.

In embodiments, the height of the carbon nanostructures may be controlled by the plasma etching time such that a solid carbon core structure having carbon nanostructure on top of said solid structure are fabricated.

In embodiments, the pyrolysis may be performed by heating in an inert atmosphere such as e.g. a nitrogen atmosphere.

In embodiments, the pyrolysis may be performed by heating the polymeric nanostructures in two stages. In the first stage, the temperature may be from 200 to 400° C., preferably 250 to 350° C., more preferably 270 to 330° C. and most preferably around 300° C.

In embodiments, the heating time in the first stage may be from 15 min to 5 hours, preferably 30 min to 2 hours, more preferably from 30 to 90 min and most preferably approximately 1 hour.

In the second stage, the temperature may be set at from 650 to 1100° C., preferably around 900-1000° C. When the pyrolysis is performed at a temperature higher than 1000° C., the obtained pyrolized nanostructures tend to be crystalline (graphitic). In embodiments, said pyrolized nanostructures are amorphous or graphitic.

In embodiments, the heating time in the second stage may be from 30 min to 5 hours.

In an embodiment, the pyrolysis may be performed by heating the polymeric nanostructures in a nitrogen environment to around 300° C. for approximately 1 hour and subsequently heating to around 900-1000° C. followed by a cooling down. any other baking procedure used for pyrolysis can be used.

In an embodiment, the method may further comprise a step of providing nanostructures on top of said pyrolysed carbon nanostructures. For instance, one can deposit catalyst particles on the pyrolysed carbon nanostructures (e.g. by using CVD), then growth carbon nanostructures (e.g. carbon nanotubes). Another option is to deposit graphite nanoflakes on top of said pyrolysed carbon nanostructures.

In an embodiment, the method may therefore further comprise a step of providing an additional level of nanostructures on top of said pyrolysed carbon nanostructures by using nanostructure fabrication methods such as CVD and growth of carbon nanostructures by deposition of catalyst particles on the structures and subsequent growth of CNTs, or for instance CVD deposition of graphite nanoflakes.

In embodiments, the method may further comprise a control of the depth of the nanostructured carbon, thereby creating hierarchical carbon structures combining bulk and nanostructured carbon. In other words, the method may further comprise a control of the depth of the pyrolized carbon nanostructures, thereby creating hierarchical carbon structures combining bulk and nanostructured carbon.

The control of the depth of the pyrolized carbon nanostructures can be operated by adapting the plasma treatment time so that the polymeric material is not entirely converted into carbon nanostructures and so that the remaining polymeric material forms bulk carbon on top of which carbon nanostructures are present.

These can be complemented by a further step providing an additional level of nanostructures on top of said pyrolysed carbon nanostructures by using nanostructure fabrication methods such as CVD and growth of carbon nanostructures by deposition of catalyst particles on the structures and subsequent growth of CNTs, or for instance CVD deposition of graphite nanoflakes. These structures have three levels of hierarchy: For instance, a microsized bulk amorphous core, micrometer to nanometer scale amorphous nanowires, and nanometer sized graphene flakes.

In embodiments, the patterning of the polymeric material may lead to the creation of a 3 dimensional shape such that 3 dimensional carbon micro structures are created comprising pyrolysed carbon nanostructures.

In embodiments, said pyrolized nanostructures may be nanowires. In embodiments, said nanostructures may be vertically aligned.

In a second aspect, the present disclosure relates to pyrolysed carbon micro and/or nano structures fabricated using the method according to any embodiment of the first aspect.

In an embodiment, the present disclosure may relate to a pyrolysed carbon nanostructure (1) being an amorphous carbon nanowire (1) having:
a. A diameter of from 5 to 100 nm, preferably 15 to 30 nm, and
b. A length of from 100 nm to 200 μm, preferably from 2 to 100 μm, more preferably from 4 to 50 μm, most preferably 6 to 27 μm.

In an embodiment, the pyrolysed carbon nanostructures may form a branched network.

In a further aspect, the present disclosure relates to an entity composed of a substrate and pyrolysed carbon nanostructures as described in the second aspect, vertically aligned on top of said substrate, thereby forming a nanowire "forest" (i.e. a ensemble of vertically aligned nanowires).

In an embodiment, said pyrolysed carbon nanostructures may be arranged in microstructures (e.g. pillars, cubes, half spheres, . . . ), each microstructure (e.g. pillar) comprising a network of pyrolysed carbon nanostructures, said microstructures (e.g. pillars) supporting an amorphous carbon overlayer, said overlayer spanning over adjacent microstructures. Said microstructure may have any three-dimensional shape and are not restricted to pillars. The pillars may have a circular section but may also have any other sectional shape (e.g. square or irregular). In said microstructures, said pyrolysed carbon nanostructures are typically crosslinked into a network.

In an embodiment, the area subtended by the extremity of said microstructures (e.g. pillars) contacting said overlayer is smaller than the area subtended by the extremity of said microstructures (e.g. pillars) contacting said substrate. This is illustrated in FIG. 2 E where a structure (3) is shown comprising two parallel pillars and an overlayer. In FIGS. 2E and F (prior to pyrolysis), the area subtended by the extremity of said pillars contacting said overlyar is the same as the area subtended by the extremity of said pillars contacting said substrate. FIG. 2G illustrates the situation after pyrolysis wherein the area subtended by the extremity of said pillars contacting said overlayer is smaller than the area subtended by the extremity of said pillars contacting said substrate. In other words, the pillars are not parallel anymore and the top of the structure spans a smaller area than the bottom of the structure. In an embodiment, the entity may be comprising nanowire forests of different heights.

In a further aspect, the present disclosure relates to a method for fabricating an entity wherein said pyrolysed carbon nanostructures may be arranged in pillars, each pillar comprising a network of pyrolysed carbon nanostructures, said pillars supporting an amorphous carbon overlayer, said overlayer spanning over adjacent pillars, said method comprising the steps of:
a. Providing a substrate,
b. Forming a pattern on said substrate, said pattern being composed of separated pillars, said pillars being made of a first polymeric material, said polymeric material comprising either:
  at least one compound with different plasma etch rates, and/or
  at least one compound that can mask a plasma etching process, and then
c. Depositing a polymer layer over said pillars, said layer spanning over adjacent pillars,
d. Subjecting said polymeric material and said polymer layer to a plasma etching process such as exposure to an oxygen comprising plasma to form polymeric nanostructures and then
e. Pyrolysing said polymeric nanostructures to form pyrolysed carbon nanostructures.

In a further aspect, the present disclosure relates to a method for fabricating an entity wherein said pyrolysed carbon nanostructures may be arranged in microstructures (e.g. pillars), each microstructure comprising a network of pyrolysed carbon nanostructures, said microstructure supporting an additional topography, said method comprising the steps of:
a. Providing a substrate,
b. Forming a pattern on said substrate, said pattern being composed of separated microstructures, said microstructures being made of a first polymeric material, said polymeric material comprising either:
  at least one compound with different plasma etch rates, and/or
  at least one compound that can mask a plasma etching process, and then
c. providing additional topography on top of said microstructure (this step can optionally be iterated to form intricate 3D stacks)
d. Subjecting said polymeric material to a plasma etching process such as exposure to an oxygen comprising plasma to form polymeric nanostructures and then
e. Pyrolysing said polymeric nanostructures to form pyrolysed carbon nanostructures.

A further aspect of the present disclosure relates to a hierarchical amorphous carbon structure comprising a solid amorphous carbon core structure having amorphous carbon nanostructures as defined in the second aspect on top of said solid amorphous carbon core.

A further aspect of the present disclosure relates to the use of pyrolysed carbon nanostructures or pyrolysed carbon micro- and nanostructures, or pyrolysed carbon nanostructure, or an entity as defined above, or a hierarchical amorphous carbon structure in an application selected from the list consisting of chemical probes, biological probes, chemical-bio- and gas sensors, super capacitors, fuel cells, battery electrodes, and heat exchangers.

In a further aspect, the present disclosure relates to a device comprising pyrolysed carbon nanostructures or pyrolysed carbon micro- and nanostructures, or pyrolysed carbon nanostructure, or an entity as defined above, or a hierarchical amorphous carbon structure.

In a further aspect, the present disclosure relates to the use of pyrolysed carbon micro and/or nano structures fabricated using the method according to any embodiment of the first aspect, in applications requiring electrochemical stability, bio-compatibility, electrical and thermal conductivity, chemical functionalization, and a large surface to volume ratio such as chemical and biological probes, chemical- bio- and gas sensors, super capacitors, fuel cells, and battery electrodes, heat exchangers.

In an embodiment, the present disclosure relates to the use of pyrolysed carbon nano structures according to the second aspect of the present disclosure in an application selected from the list consisting of chemical probes, biological probes, chemical- bio- and gas sensors, super capacitors, fuel cells, battery electrodes, and heat exchangers.

In a further aspect, the present disclosure relates to a device comprising pyrolysed carbon nano structures according to the second aspect of the present disclosure. Examples of such devices are chemical probes, biological probes, chemical-bio- and gas sensors, super capacitors, fuel cells, battery electrodes, and heat exchangers.

In a further aspect, the present disclosure relates to a hierarchical amorphous carbon structure as described or obtained in any embodiment above, fabricated on an electrode for electrical integration. An aspect of the present disclosure therefore relates to a pyrolysed carbon nanostructures or pyrolysed carbon micro- and nanostructures, or an entity or a hierarchical amorphous carbon structure according as described in any embodiment herein, wherein said pyrolysed carbon nanostructures are contacting an electrode.

BRIEF DESCRIPTION OF THE DRAWINGS

All figures are intended to illustrate some aspects and preferred embodiments. The figures are depicted in a simplified way for reason of clarity. Not all alternatives and options are shown and therefore the disclosure is not limited to the content of the given drawings. Like numerals are employed to reference like parts in the different figures.

FIG. 2G illustrates the shrinkage of the 3D structure after pyrolysis thereby forming an intricate 3D geometry in an embodiment of the present disclosure.

FIG. 8A illustrates a SEM image (tilted view) of an array of multiple height SU8®plasma treated amorphous carbon pillars before pyrolysis according to embodiments of the disclosure.

FIG. 8B illustrates a SEM image (tilted view) of an array of multiple height plasma treated amorphous carbon pillars (nanowires) after pyrolysis according to embodiments of the disclosure.

FIG. 8C illustrates a SEM image (top view) of an array of multiple height 3D amorphous carbon microstructures after pyrolysis according to embodiments of the disclosure.

DESCRIPTION OF THE PREFERRED EMBODIMENTS

Figure 1:
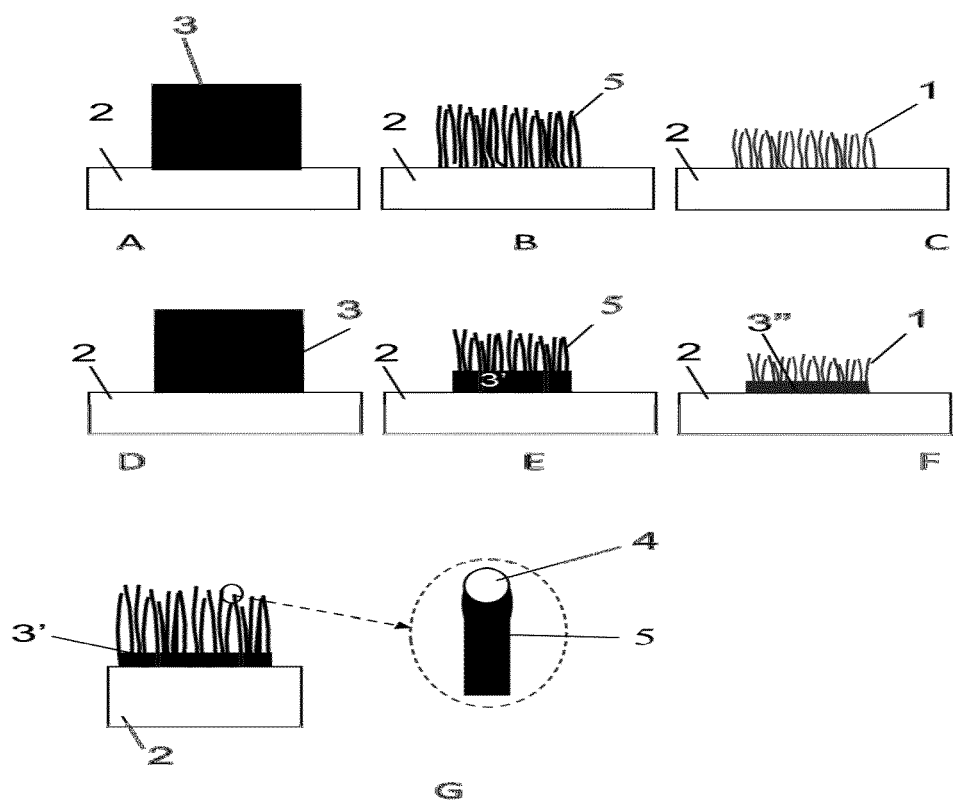
FIGS. 1A-1C illustrate a schematic overview of the main process steps (being A photoresist patterning (optional), B plasma treatment and C pyrolysis) involved in the fabrication of amorphous carbon nanostructures according to embodiments of the disclosure whereby the patterned photoresist (polymeric) structure is completely transformed into carbon nanostructures.
FIGS. 1D-1F illustrate a schematic overview of the main process steps (being photoresist patterning, plasma treatment and pyrolysis) involved in the fabrication of amorphous carbon nanostructures according to embodiments of the disclosure whereby only part of the patterned photoresist (polymeric) structure is transformed into carbon nanostructures.
FIG. 1G illustrates a close-up of the (polymer) nanostructures after plasma treatment and before pyrolysis according to embodiments of the disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Moreover, the term top and the like in the description and the claims are used for descriptive purposes and not necessarily for describing relative positions. It is to be understood that the terms so used are interchangeable under appropriate circumstances and that the preferred embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary preferred embodiments, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that preferred embodiments may be practiced without these specific details. In other instances, well-known methods, structures and techniques have not been shown in detail in order not to obscure an understanding of this description.

The term "nanostructure" as referred to in the claims and the description is used to define structures having critical dimensions below 1 μm. For instance the carbon nanowires have a diameter of typically 10 to 100 nm.

The term "microstructure" as referred to in the claims and the description is used to define structures having critical dimensions larger than 1 μm.

The term "hierarchical structures" as referred to in the claims and the description is used to define structures organized in a tree-like fashion, e.g. a structure comprising nano-sized branches attached to a micro-sized trunk.

The term "vertically aligned" as referred to in the claims and the description is used to define structures which are substantially perpendicular to the substrate.

The term "compound with different plasma etch rates" as referred to in the claims and the description refers to a chemical compound composed of different parts, some of said parts allowing a first etch rate by a plasma while other of said parts allow a second etch rate by a plasma, different from said first etch rate. An example is the differential etch rates of aromatic and linear parts of a polymeric material.

The term "nanowire" as referred to in the claims and the description typically refers to elongated objects having a diameter less than 1 μm and preferably less than 100 nm, and having a length to diameter ratio typically larger than 10.

The disclosure will now be described by a detailed description of several preferred embodiments. It is clear that other preferred embodiments can be configured according to the knowledge of persons skilled in the art without departing from the true spirit or technical teaching of the disclosure as defined by the appended claims.

In an embodiment, the present disclosure relates to a fabrication method for vertically aligned amorphous carbon nanostructures thereby making use of state of the art processing steps such as plasma treatments and pyrolysis.

It is a goal of embodiments of the disclosure to provide a method for fabricating amorphous (or crystalline) carbon nanostructures which can be further shaped into hierarchical structures where nanofibres are embedded on a micro-sized solid core.

Embodiments of the method of the disclosure have the advantage that these hierarchical carbon structures greatly enhance the surface area while limiting of transport losses. These hierarchical structures are therefore advantageous in engineering, and could play a key role in the development of e.g. new electrodes for micro sensors, batteries, super capacitors, and fuel cells as well as for bio-applications.

In a first aspect, preferred embodiments provide amorphous carbon nanostructures and a method for fabricating said carbon nanostructures. This method comprises at least following steps:
  Providing a substrate, and then
  Depositing a polymeric material comprising either compounds with different plasma etch rates or compounds that can mask a plasma etching process, and then
  Subjecting said polymeric layer to a plasma etching process (e.g. oxygen plasma) to form polymeric nanostructures and then
  Pyrolysing said polymeric nanostructures to form pyrolysed carbon nanostructures.

In embodiments, the method may comprise at least following steps:
  Providing a substrate, and then
  Depositing a polymeric material comprising either:
    compounds with different plasma etch rates, and/or
    at least one compound that can mask a plasma etching process, and then
  Subjecting said polymeric material to a plasma etching process such as exposure to an oxygen comprising plasma to form polymeric nanostructures and then
  Pyrolysing said polymeric nanostructures to form pyrolysed carbon nanostructures.

According to embodiments, the substrate may be a semiconductor substrate such as a silicon wafer or any other material compatible with the plasma and pyrolysis treatments. If required by the application, the process can also be applied to polymeric material without a supporting substrate.

According to embodiments the polymeric material may be deposited using any state of the art deposition techniques such as spin-coating techniques.

Other deposition methods of the polymeric material such as casting, moulding, and printing are also possible.

According to embodiments the polymeric material may either be a bulk material, or pre-shaped by any method. In case the polymeric material is pre-shaped, the method for fabricating (preferably amorphous) carbon nanostructure then further comprises after the step of providing the polymeric material a patterning step (e.g. UV photolithographic patterning of a polymeric photoresist layer) to obtain polymeric structures instead of a polymeric (bulk) layer. Some deposition methods already comprising patterning (and hence avoid additional patterning steps) may also be used such as casting, moulding, and printing techniques.

According to embodiments the polymeric material preferably should not reflow at high temperatures. Preferably said polymeric material is a highly cross-linked polymer such as commercially available photosensitive materials (also referred to as "photoresist") such as SU8®. SU8® comprises metallic nanoparticles such as Sb which may act as a masking compound in subsequent plasma etching processes.

In an embodiment, said polymeric material is a highly cross-linked polymer comprising metallic nanoparticles. Said metallic nanoparticles may be Sb nanoparticles. They may act as a masking compound in subsequent plasma etching processes.

According to embodiments the compounds in the polymeric material that can mask a plasma etching process may be metallic (such as Sb), ceramic (such as Al-oxides, Sb-oxides), or other micro or nanoparticles which are plasma resistant. Said masking compounds may be either present in said polymeric layer, or alternatively being co-deposited during the plasma etching process. Said masking compounds are typically such that they define the dimensions of the carbon nanostructures to be fabricated (meaning that these masking compounds are not etched and the polymeric material underneath is also not etched away).

According to embodiments, the choice of polymeric material comprising masking compounds and the choice of plasma composition used to fabricate carbon nanostructures may be such that carbon nanostructures with the desired dimensions are formed. Without being bound by theory, several mechanisms can induce the formation of the nanostructures with desired dimensions. For instance, differential etch rates of different polymer groups (e.g. differential etch rates of aromatic and linear parts of the polymeric material), and local masking of the polymeric material by components that are either mixed in the polymer or sputtered on the polymer during the plasma treatment, can induce the nanostructures. The masking particles may thereby act as a mask to form nanostructures in the form of nanowires (fibres, or other nanostructures). Said plasma may be an oxygen comprising plasma and said polymeric material may be commercially available SU8®. Analysis of the material composition before and after plasma treatment of SU8® revealed a great increase in density of antimony (a component present in SU8®) at the surface. Further, traces of aluminium were found which are sputtered from the plasma chamber and these may also locally mask the polymer material from the oxygen plasma. Depending on the plasma processing parameters, fibres (1) can be generated that span over either the entire height of the structure as illustrated in FIG. 1A-C or only over the top surface of the polymeric structure (FIG. 1D-F). The latter enables the formation of hierarchical structures with a combined nanowire (1)-bulk (3") carbon structure.

FIG. 1A shows a substrate (2) on which a photoresist (3) is deposited. FIG. 1B shows the element of FIG. 1A after an $O_2$ plasma treatment performed for a time sufficient to form nanowires spanning the entire height of the obtained nanostructure. FIG. 1C shows the element of FIG. 1B after a pyrolisis step.

FIG. 1D shows a substrate (2) on which a photoresist (3) is deposited. FIG. 1E shows the element of FIG. 1D after an $O_2$ plasma treatment performed for a time adapted so as to form nanowires (1) spanning only part of the height of the obtained nanostructure. In other words, the obtained nanostructure comprises a bulk carbon structure (3") on top of which nanowires (1) are present. FIG. 1G shows that a metallic nanoparticles (4) is present on top of the polymeric nanostructures (5).

According to embodiments the step of subjecting said polymeric layer to a plasma etching process (e.g. oxygen plasma) to form polymeric nanostructures may be performed using an $O_2$ comprising plasma treatment.

In embodiments, said $O_2$ comprising plasma treatment may be performed for from 5 to 60 minutes, preferably from 10 to 60 minutes.

In embodiments, said $O_2$ comprising plasma treatment may be performed with a $O_2$ flow rate of from 100 to 400 sccm, preferably from 120 to 180 sccm.

In embodiments, said $O_2$ comprising plasma treatment may be performed with a chamber pressure of from 75 to 300 mTorr, preferably from 100 to 200 mTorr.

In embodiments, said $O_2$ comprising plasma treatment may be performed with a plasma power of from 150 to 600 W, preferably from 200 to 400 W.

As an example said plasma treatment may be performed for 10 up to 60 minutes, an $O_2$ flow rate of 200 sccm, at a chamber pressure around 150 mTorr and a plasma power around 300 W which induces the formation of nanostructures (filaments) in SU8®.

Optionally or alternatively, the plasma treatment can be confined to a certain region of the said polymeric material by applying a masking method such as hard masks.

According to embodiments, and without being bound by theory, different mechanisms may cause the formation of the nanostructures during the plasma treatment. When using for example SU-8® photoresist (which mainly contains bisphenol A-epichlorohydrin-formaldehyde copolymer (an epoxy/phenolic resin) [Wang, C. L., R. Zaouk, and M. Madou, Local chemical vapor deposition of carbon nanofibers from photoresist. Carbon, 2006. 44(14), 3073-3077], the formation of nanostructures could be due to different etch rates of aromatic and linear parts in the polymer chain. Further, SU8 contains antimony, which is enriched at the surface upon plasma activation, and can reach up to 19% of the surface composition after plasma treatment as observed through XPS analysis (see table 1). This Antimony, together with small amounts of Aluminum that are sputtered from the plasma chamber (see table 1) may locally mask the SU8 film and thereby induce the formation of nanostructures (fibres, wires). This masking effect, combined with the anisotropy of the plasma treatment induces a vertical alignment of the nanostructures (fibres). Interestingly, it is found that the formed nanostructures are maintained during the subsequent pyrolysis process to form carbon nanostructures and result in forests of vertically aligned carbon nanostructures (fibres). Vertically aligned CNW forests are high aspect ratio structures having anisotropic properties.

In an embodiment, novel anisotropic microarchitectures comprising vertically aligned CNWs can be made by oxygen plasma treatment of a patterned photoresist, followed by pyrolysis. Interestingly, these structures can also be shaped into deterministic three-dimensional (3D) hierarchical structures where nanofibres are anchored to a microsized solid carbon core. These structures are reminiscent of biological dendrite architectures which emerged in nature as an optimization between the maximization of a surface area and the minimization of transport losses. Mimicking such structures in engineering could play a key role in the development of new electrodes for microsensors [Soleymani, L., et al., Nature Nanotechnology, 2009. 4(12): p. 844-848; Soleymani, L., et al., Angewandte Chemie-International Edition, 2009. 48(45): p. 8457-8460.], batteries [Sharma, C. S., A. Sharma, and M. Madou, Langmuir. 26(4): p. 2218-2222.], supercapacitors [Nguyen-Vu, T. D. B., et al., Vertically aligned carbon nanofiber arrays: An advance toward electrical-neural interfaces. Small, 2006. 2(1): p. 89-94.], and fuel cells [Yun, W., et al., Journal of Power Sources: p. 4796-803.], as well as for various other biomimetic applications [Huang, J. H., et al., Advanced Materials, 2009. 21(35): p. 3567; Boesel, L. F., et al., Advanced Materials. 22(19): p. 2125-2137; Gao, H. J., et al., Mechanics of Materials, 2005. 37(2-3): p. 275-285.].

According to embodiments the step of transforming the (polymeric) nanostructures into amorphous or crystalline carbon nanostructures is performed by pyrolysis. Depending on the pyrolysis temperature different allotrope carbon forms may be obtained.

In an embodiment, said pyrolysis step may be performed in a two steps process wherein the nanostructures are first baked at a temperature of from 200 to 400, preferably from 250 to 350° C. and subsequently pyrolysed at a temperature of from 650 to 1100° C., preferably from 900 to 1000° C. to form amorphous carbon.

In an embodiment, said pyrolysis step may be performed in a two step process wherein the nanostructures are first baked at a temperature around 300° C. and subsequently pyrolysed at a temperature around 900° C. to form amorphous carbon. However, baking at higher temperatures (e.g. higher than 900° C., preferably higher than 950° C. and more preferably higher than 1000° C.) may induce the formation of crystalline (graphitic) carbon nanostructures which might be advantageous in certain applications. The pyrolysis step may be performed in a nitrogen ambient or alternatively in a N2/H2 (forming gas) ambient, a noble gas ambient (Ar, . . . ) or in vacuum.

According to embodiments, pyrolysis may be performed by heating the samples in a nitrogen environment to 300° C. (40 min ramp followed by 30 min hold) and subsequently to 900° C. (90 min ramp followed by 60 min hold) followed by a slow cooling down to room temperature (at least 12 hours), similar to the process reported in carbon MEMS papers [Sharma, C. S., A. Sharma, and M. Madou, Multiscale Carbon Structures Fabricated by Direct Micropatterning of Electrospun Mats of SU-8 Photoresist Nanofibers. Langmuir. 26(4), 2218-2222]. Other thermal cycling steps may be used for instance to reduce internal stresses or change the electrical properties. During the pyrolysis process, all volatile components are evaporating from the polymeric material, causing a further shrinkage of the polymeric nanostructure into the carbon nanostructures (fibres). As an example the polymeric nanostructures (before pyrolysis) may be polymeric nanostructures having dimensions of approximately 100 nm in diameter before pyrolysis and these will shrink towards carbon nanostructures (after pyrolysis) having dimensions of approximately 15 to 30 nm in diameter. XPS data show great reduction in oxygen groups during pyrolysis (see FIG. 3C), and interestingly, no traces of antimony were detected by XPS after pyrolysis (see table 1). The height over which the nanowires span can be simply controlled by the initial thickness of the SU8 layer and the parameters of the oxygen plasma treatment, for instance, longer plasma treatment allows etching through thicker SU8 structures. We found typical "forest" heights of 6 µm after 10 min, 13 µm after 30 min, and 27 µm after 60 min plasma treatment, as shown in FIG. 3D (all experiments at 200 sccm O2, 150 mTorr and 300 W).

FIGS. 3A-3E are illustration and SEM images of the top surface (A) and sidewalls (B) of CNW forests at different stages of the fabrication process, along with corresponding XPS data (C): (top) SU8 pillars after development, (middle) after oxygen plasma (step (i)), and (bottom) after pyrolysis (step (ii). (D) Evolution of the CNW forest with increasing plasma treatment time, followed by identical pyrolysis treatment. (E) Raman spectroscopy of bulk pyrolysed SU8® and CNWS.

It is an advantage of above described pyrolysed carbon nanostructures and thus obtained "carbon nanostructure (fibres) forests" compared to state of the art grown carbon nanostructures by CVD that the carbon nanostructures according to the disclosure may be fabricated (depending on the pyrolysis conditions) without a graphitic lattice and completely consisting of amorphous carbon which is confirmed by Raman spectroscopy (see FIG. 3E).

In embodiments, the morphology of the carbon nanostructures (wires) of the present invention is very different from state of the art carbon nanotubes (CNTs) since they typically form a more branched network as illustrated in FIG. 3A-3C. The vertical structuring of the carbon nanostructures of the present disclosure may be induced by the anisotropy of the plasma etching rather than the self-supporting organization mechanism observed in state of the art CVD grown CNTs. Because of these differences, the process developed in the present disclosure complements the well established CVD processes for the growth of CNT forests. Further, amorphous material offers advantages in applications needing chemical functionalization, or where the catalyst particles used for CNT synthesis are prohibited. In addition, the proposed fabrication technology is low cost and easily accessible, and it circumvents a number of limitations related to state of the art CVD grown CNTs. For instance, by stacking polymeric layers, the method according to the present disclosure allows fabricating nanowire forests with different heights, which is difficult to achieve with state of the art CVD grown CNTs (see first and second particular embodiment of the disclosure below).

Finally, the method according to the present disclosure enables the fabrication of hierarchical carbon structures. The depth over which the carbon nanostructures extent may be determined by the plasma parameters (FIG. 3D), thus depending on the initial polymeric structure (geometry) and the plasma parameters, structures consisting entirely out of nanostructures (fibres) can be fabricated as well as a micropillar with a solid carbon core surrounded by a carbon nanostructure (fibre) network as illustrated in FIG. 4C. FIG. 4 (A) shows a SEM images of aligned topology and Y-junctions (arrows) of pyrolysed CNWs. FIG. 4 (B) is a TEM image of the CNWs after pyrolysis. FIG. 4 (C) is a cross-section view of a pillar showing its hierarchical structure where the CNWs are attached to a solid core. The size of the core is controlled by the plasma treatment time. The relative amounts of solid carbon and carbon nanostructures in the form of fibres acting as "nanoporous" carbon can be finely controlled by the plasma parameters, providing a straightforward means of manipulating the hierarchical structure. These unique hierarchical structures where the core conveys mechanical robustness as well as low overall electrical resistivity, and the corrugated carbon nanostructure (fibre) network provides a high active surface area are reminiscent of hierarchical structures found in nature, and are of great interest for the development of the microelectrodes, biosensors and other micro systems.

TABLE 1

XPS data of SU8 ®polymeric layers at different stages of the process.

| Sample | C1s (285 eV) | C1s (286.7 eV) | C1s (288.8 eV) | C1s (290.2 eV) | C1s (291.5 eV) | N1s | Sb3d | O1s | Al2p |
|---|---|---|---|---|---|---|---|---|---|
| Untreated SU8 | 49.26 | 30.00 | 0.00 | 0.00 | 1.49 | 0.00 | 0.00 | 19.24 | 0.00 |
| Plasma treated SU8 | 15.29 | 14.61 | 3.84 | 1.78 | 1.96 | 1.43 | 18.94 | 37.10 | 5.06 |

| Sample | C1s (285 eV) | C1s (286.4 eV) | C1s (287.7 eV) | C1s (289.14 eV) | C1s (290.6 eV) | C1s (292.2 eV) | O1s | Al2p |
|---|---|---|---|---|---|---|---|---|
| Pyrolysed SU8 | 67.96 | 10.67 | 5.99 | 4.91 | 4.51 | 2.99 | 2.97 | 0.00 |
| Plasma treated Pyrolysed SU8 | 65.17 | 10.93 | 6.14 | 4.74 | 4.25 | 3.05 | 4.84 | 0.88 |

Unlike carbon nanotube (CNT) forests grown by CVD, the CNW forests are highly branched (see FIG. 4A), and the individual wires consist of amorphous carbon (see Raman spectroscopy FIG. 3E, and TEM FIG. 4B). While amorphous CNWs will not match the unique mechanical and electrical properties of CNTs, CNWs may offer advantages in applications needing chemical functionalization [Sun, B., et al., Langmuir, 2006. 22(23): p. 9598-9605; Davis, F., et al., Analytical Chemistry, 2007. 79(3): p. 1153-1157; Brooksby, P. A. and A. J. Downard, Langmuir, 2005. 21(5): p. 1672-1675.], or where metal catalyst particles typically used for CNT synthesis (e.g., Fe, Ni or Co) are prohibited. Further, the proposed fabrication technology is easily accessible, and cost-effective, especially since the lithography step can be replaced by for instance SU8® transfer molding [Copic, D., et al., Lab on a Chip. 11(10): p. 1831-1837.].

Finally, the proposed technology provides additional architectural control. For instance, by subsequently coating and developing SU8® layers [Lee, J. A., et al., Journal of Micromechanics and Microengineering, 2008. 18(3).] prior to plasma etching and pyrolysis, multi-level nanowire forests are made (see FIGS. 2A and B). Further, by controlling the plasma time, the depth over which the nanowires extend is changed (FIG. 3D), thus structures consisting entirely out of nanowires can be fabricated as well as micropillar with a solid core surrounded by a nanowire network as illustrated in FIG. 4C. The relative amounts of solid and nanoporous carbon can be finely controlled by the plasma parameters, providing a straightforward means of manipulating the hierarchical structure. In these unique hierarchical structures, the core conveys mechanical robustness as well as low overall electrical resistivity, and the CNWs provides a high active surface area which is reminiscent of natural networks and dendrites.

In a first particular embodiment, the disclosure provides a method for integrating (amorphous) carbon nano (fibres) structures electrically in a deterministic and scalable way. For the integration of (amorphous) carbon nanostructures (fibres) of the present disclosure in microsystems, and other applications, a 3D structuring method is developed. This is achieved by turning two normally unwanted effects to our advantage. The first effect, "T-Topping", refers to a thin overlayer that is formed on top of the polymeric microstructures when there is an offset in lithography parameters as illustrated in FIG. 5A. By promoting the formation of such films, they can span over adjacent structures. The formation of the overlayer may be induced by soft-baking in convection ovens rather than hot-plates, and by exposure using a broad UV spectrum source. The fabrication of suspended carbon sheets does not require a second exposure step. Taking advantage of a second unwanted effect, namely the shrinking of the polymeric layer during pyrolysis, the top layer will pull adjacent pillars together resulting in the three-dimensional canopies as shown in FIGS. 5A and 5B. A diverse collection of canopies are fabricated by changing the layout of the micropillars that support the thin polymeric overlayer. This 3D shaping method can be combined with the hierarchical carbon nanostructure (fibre) network fabrication described above, by simply applying the oxygen plasma treatment before the pyrolysis, and can be combined with multiple height forests. Further, these structures can be contacted electrically by defining bottom electrodes in a first lithography step. These bottom electrodes can also be formed by the pyrolysis of a polymeric materials as well as other conductive material that is compatible with the pyrolysis process such as TiN.

Figure 6:
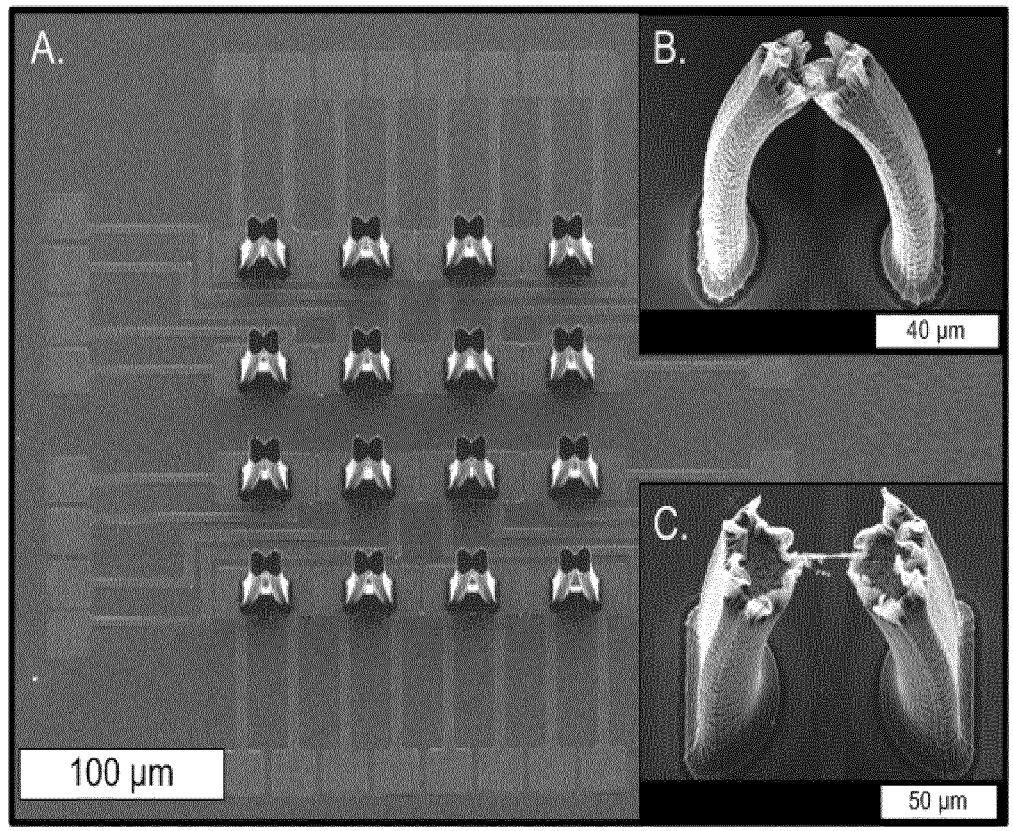
FIG. 6A illustrates 3 dimensional amorphous carbon nanostructures according to embodiments of the disclosure to form an amorphous carbon (sensor) array comprising using TiN bottom electrodes.
FIGS. 6B and 6C illustrate close-ups of the 3 dimensional amorphous hierarchical carbon sensor elements analogous to those shown in FIG. 6A according to embodiments of the disclosure.

The "bridging" carbon micropillars are an attractive means to build 3D microarchitectures using only planar processing methods. Furthermore, these architectures are especially effective as sensing structures, because the joints and adjacent legs can be used as sensing nodes. It was surprisingly found that by simply changing the spacing between the pillars, structures ranging from bridges (FIG. 6B) to extremely fine suspended wires (FIG. 6C) can be induces. The latter may have a diameter of approximately 1 μm and may consist of a network of carbon nanofibres with a diameter of 30 nm or less. These delicate structures may be integrated repeatedly over arrays of micropillars as illustrated in FIG. 6A.

Alternatively, 3D structures can be formed by for instance capillary self assembly of the polymeric structures, or other 3D shaping methods.

Figure 10:
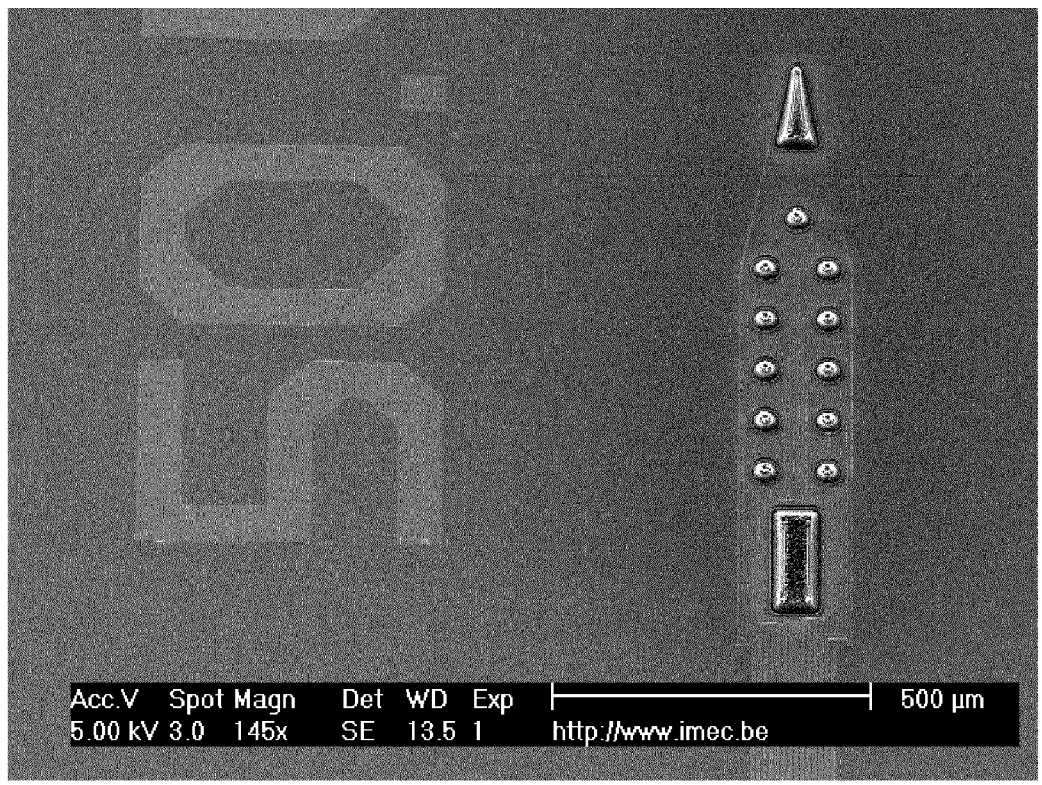
FIG. 10 shows hierarchical carbon nanowires patterned on TiN electrical leads for application in a neural probe according to an embodiment of the present disclosure.
Figure 11:
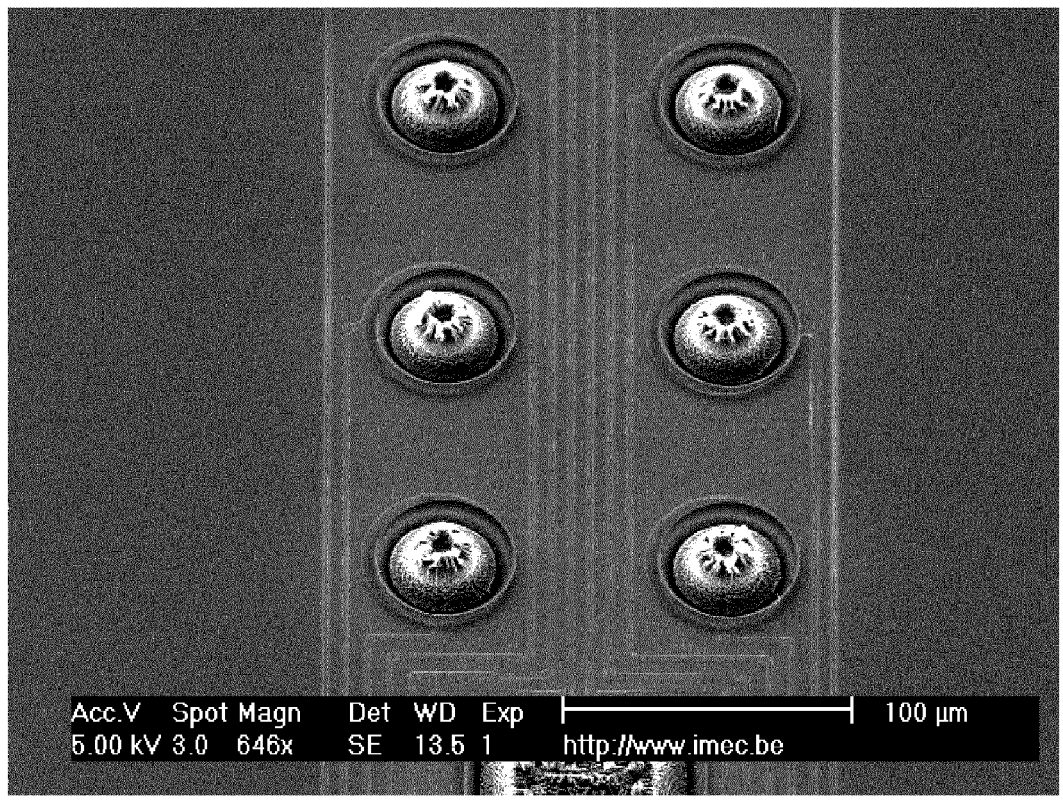
FIG. 11 shows an enlarged portion of FIG. 10.

A wide variety of applications can be conceived with the developed material. Especially applications requiring high surface to volume ratios and good electrochemical stability could profit from these materials. Examples include electrodes for batteries or biological interfaces, and sensors. An example of a bioprobe using the developed material is shown in FIGS. 10 and 11.

Figure 12:
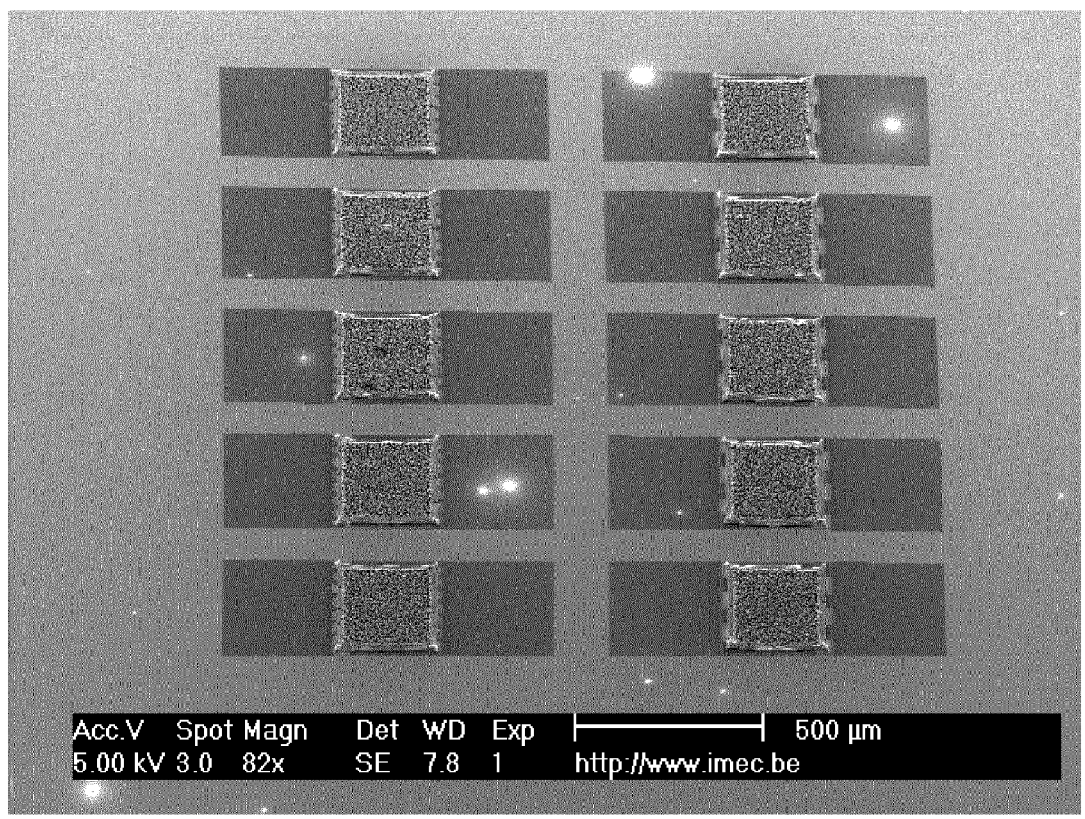
FIG. 12 shows an array of carbon nanowires deposited on inter-digitated TIN electrodes for a microsensor application according to an embodiment of the present disclosure.
Figure 13:
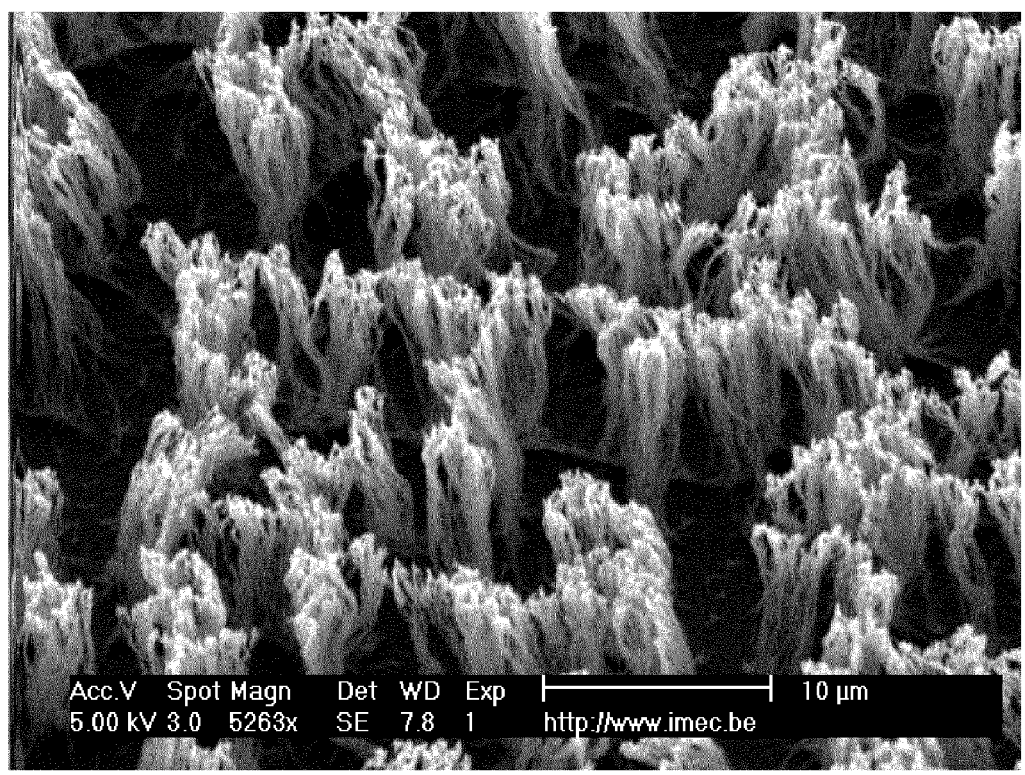
FIG. 13 shows en enlarged portion of FIG. 12.

A wide variety of sensor implementation can be conceived with the developed material. For instance, FIG. 12 shows a design where an array of amorphous nanowires (FIG. 13) is deposited onto inter-digitated electrodes.

Alternatively, the 3D shaping process can be used to fabricate suspended sensing nodes as illustrated in FIG. 9A. Both the architecture of FIGS. 12 and 9A can be applied in a wide variety of applications including for instance bio and gas sensors.

Figure 5:
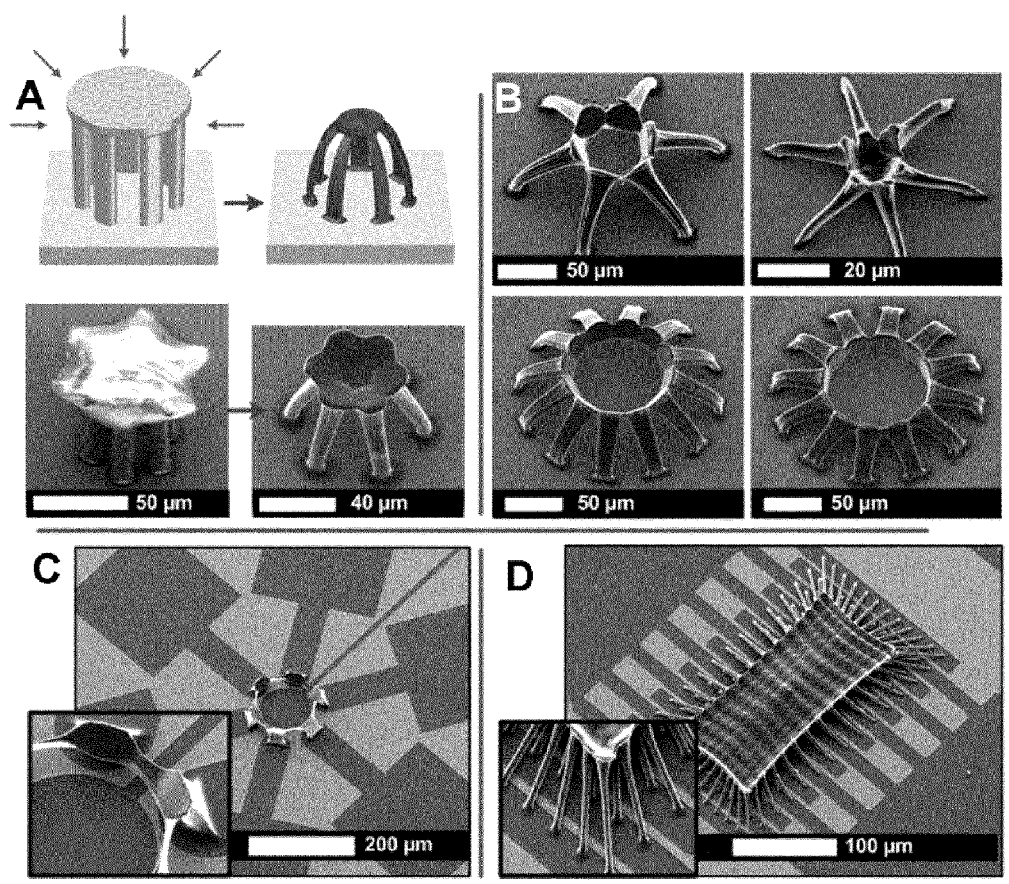
FIG. 5A shows a computer model (top) SEM images (bottom) of a 3 dimensional amorphous carbon nanostructures fabricated from a suspended 3 dimensional (hollow) patterned photoresist (polymeric) structure before (left side) and after pyrolysis (right side) according to embodiments of the disclosure.
FIG. 5B illustrates 3 dimensional amorphous carbon nanostructure after pyrolysis forming a 3 dimensional intricate geometry according to embodiments of the disclosure.
FIGS. 5C and 5D illustrate 3 dimensional amorphous carbon nanostructures according to embodiments of the disclosure integrated on carbon bottom electrodes.

FIG. 5 (A) are a FEM simulation (top) and SEM images (bottom) of the 3D carbon microarchitecture formation by the directed shrinkage of an SU8® topping layer during pyrolysis. FIG. 5 (B) are SEM images of six and twelve legged 3D geometries. Left and right images have a different tilt angle, which is controlled by the pillar height. FIG. 5 (C) is a 3D circular bridge with 6 legs and integrated pyrolysed carbon bottom electrodes. FIG. 5 (D) is a 3D arrangement of 180 legs connecting a suspended carbon sheet to interdigitated bottom electrodes.

Figure 8:
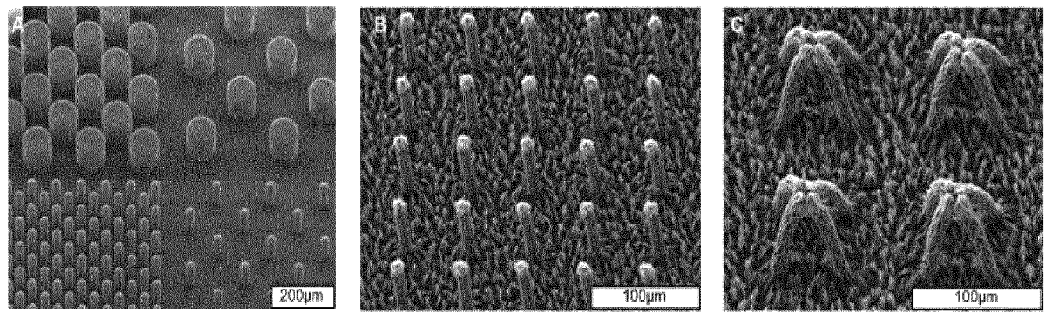
FIG. 8 shows a multiple height 3D microstructures array.

For the integration of CNW forests in microsystems and other applications, we have developed a method of 3D structuring. First, we took advantage of the "T-Topping" effect [Lee, J. A., et al., Journal of Micromechanics and Microengineering, 2008. 18(3).], by forming a thin overlayer spanning adjacent SU8® microstructures (see FIG. 5A). Here the formation of the overlayer was induced by soft-baking in convection ovens rather than on hotplates [Wang, C. L., et al., Journal of Microelectromechanical Systems, 2005. 14(2): p. 348-358.], and by exposure to a broad UV spectrum source [see Wang et al.]. As previously reported for the fabrication of suspended carbon sheets [see Wang et al], the formation of these films does not require a second exposure step. Second, we took advantage of the lateral shrinkage of the overlayer during pyrolysis, which pulls adjacent pillars together into three-dimensional canopies shown in FIG. 5A,B. Diverse canopy shapes were fabricated in a controlled way by changing the layout of the micropillars that support the overlayer. The transformation of the SU8® structures into 3D carbon shapes can be predicted qualitatively using finite element models (FEM) where the pyrolysis was simulated as an isotropic thermal contraction problem using Comsol as illustrated in FIG. 5A. This 3D fashioning method can be combined with the hierarchical nanofibre network fabrication described above, by simply applying the oxygen plasma treatment before the pyrolysis (FIGS. 6A-C and 9 A-D)), and can also be combined with multiple-height processing (FIG. 8B).

Further, CNW processing can enable the design and construction of electrically-integrated 3D microarchitectures using only planar patterning operations. For this, we first define bottom electrodes using either electrodes made by pyrolysis of SU8, similar to those disclosed in [Wang et al.] (FIG. 5C-D), or TiN patterned by lift-off prior to SU8 lithography (FIG. 9A-D). We found that simply changing the spacing between the pillars induces structures ranging from arches (FIG. 6A,B) to extremely fine suspended bridges (FIG. 9C,D). The bridges have a lateral dimension of approximately 1 μm and consist of a network of CNWs with a diameter of 30 nm or less (FIG. 9D). These delicate structures are found repeatedly across arrays of micropillars (FIG. 9A,C).

In closing, CNW structures offer hierarchical and architectural tunability, as well as cost-effective compatibility with standard lithographic processing that complements existing methods for fabricating nanostructured carbon. Electrically integrated CNWs could greatly increase the performance of systems requiring electrochemically stable electrodes with a large surface area such as biosensors, batteries, fuel cells, and bio-probes.

In a second particular embodiment, the present disclosure provides a method for fabricating carbon nanostructures having more complex geometries e.g. by stacking the structures introduced in both the first and/or second aspect of this disclosure. This method comprises at least the following steps:

Providing a substrate, and then

Depositing a first polymeric material comprising either compounds with different plasma etch rates or compounds that can mask a plasma etching process, and then Optionally patterning said first polymeric material in planar or 3D structures in order to form a first polymeric structure, and then Optionally subjecting said first polymeric structure to a plasma etching process (e.g. oxygen plasma) to form polymeric nanostructures and then Optionally pyrolysing said polymeric nanostructures to form carbon nanostructures.

Depositing a second polymeric material comprising either compounds with different plasma etch rates or compounds that can mask a plasma etching process onto said first polymeric structure, and then Patterning said second polymeric material in order to form a second polymeric structure onto said first polymeric structure, and then Subjecting said first and second polymeric structure to a plasma etching process (e.g. oxygen plasma) to form polymeric nanostructures and then Pyrolysing said polymeric nanostructures to form carbon nanostructures.

Optionally iterate these process steps to stack as many layers as required by the application.

FIG. 2A-2D illustrates the formation of carbon nanostructures (fibres) (1) with different heights. This may be achieved by first depositing (e.g. by spin coating, casting, moulding, or printing) a first polymeric layer (3) and for instance lithographically pattern said first polymeric layer (1) and subsequent depositing (e.g. by spin coating, moulding, casting, or printing) a second polymeric layer (6) and for instance lithographically pattern said second polymeric layer (6) onto said first polymeric structure (3). The plasma treatment can be performed only after the first deposition, only after the second deposition or both after the first and second deposition. Depending on the plasma processing parameters, carbon nanostructures (1) may be generated that span over either the entire height of the first (3) and second (6) polymeric structure (not illustrated) or alternatively only over the top surface of both polymeric structures (3, 6) (FIG. 2D) thereby leaving a solid carbon core (3").

Figure 2:
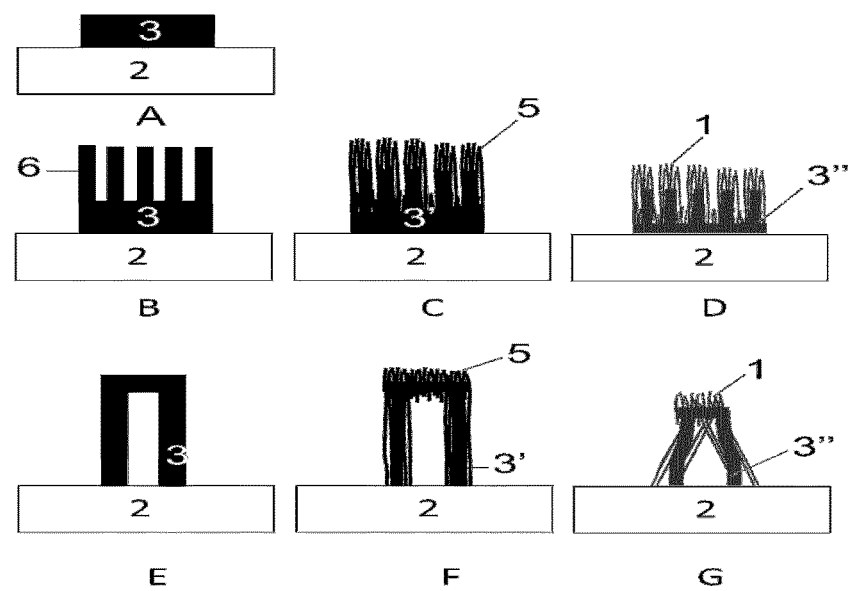
FIG. 2A-2D illustrates a schematic overview of the main process steps (being photoresist patterning (optional), plasma treatment and pyrolysis) involved in the fabrication of amorphous carbon nanostructures with different heights thereby making use of 2 subsequent photolithographic patterning steps.
FIG. 2E-2G illustrates a schematic overview of the main process steps (being photoresist patterning, plasma treatment and pyrolysis) involved in the fabrication of 3 dimensional amorphous carbon nanostructures thereby starting from a suspended 3 dimensional (hollow) patterned photoresist (polymeric) structure, according to an embodiment of the present disclosure.

According to embodiments the first and second polymeric structures together may form a suspended 3 dimensional (hollow) polymeric structure as shown in FIG. 2E-2G in order to create 3D carbon nanostructures, as discussed in the second aspect of the disclosure.

FIG. 2E-2G illustrates a schematic overview of an embodiment where the main process steps (being photoresist patterning, plasma treatment and pyrolysis) involved in the fabrication of 3 dimensional amorphous carbon nanostructures thereby starting from a suspended 3 dimensional (hollow) patterned photoresist (polymeric) structure (3). FIG. 2G illustrates the shrinkage of the 3D structure (3') after pyrolysis thereby forming an intricate 3D geometry (3").

Figure 7:
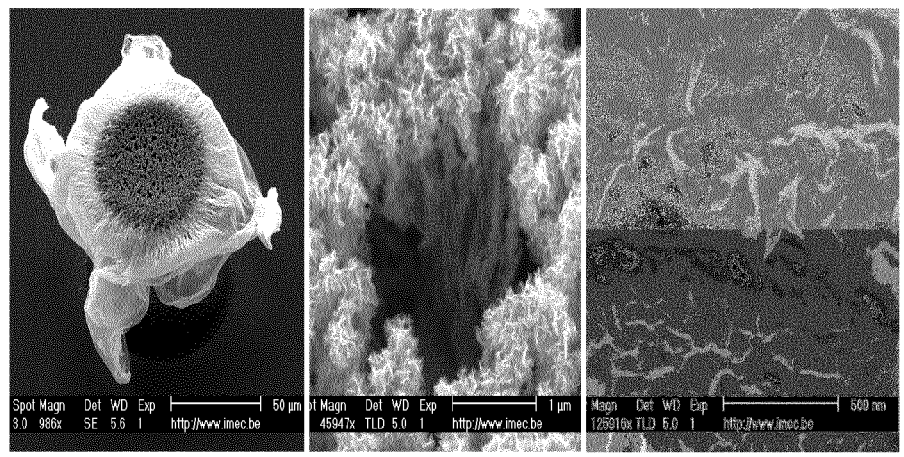
FIGS. 7A-7C illustrate close-ups of 3 dimensional amorphous carbon structures further coated (on top) with graphite flakes by CVD according to embodiments of the disclosure.

According to embodiments the above described carbon nanostructures may be further complemented with a third level of hierarchy by coating these structures with additional nanostructures including carbon nanotubes or graphite flakes using for instance chemical vapour deposition (CVD). FIG. 7A-7C shows an exemplary hierarchical carbon structure comprising a solid amorphous carbon core surrounded by carbon nanowires according to the process described above, and which are additionally coated with graphite nanoflakes.

Figure 9:
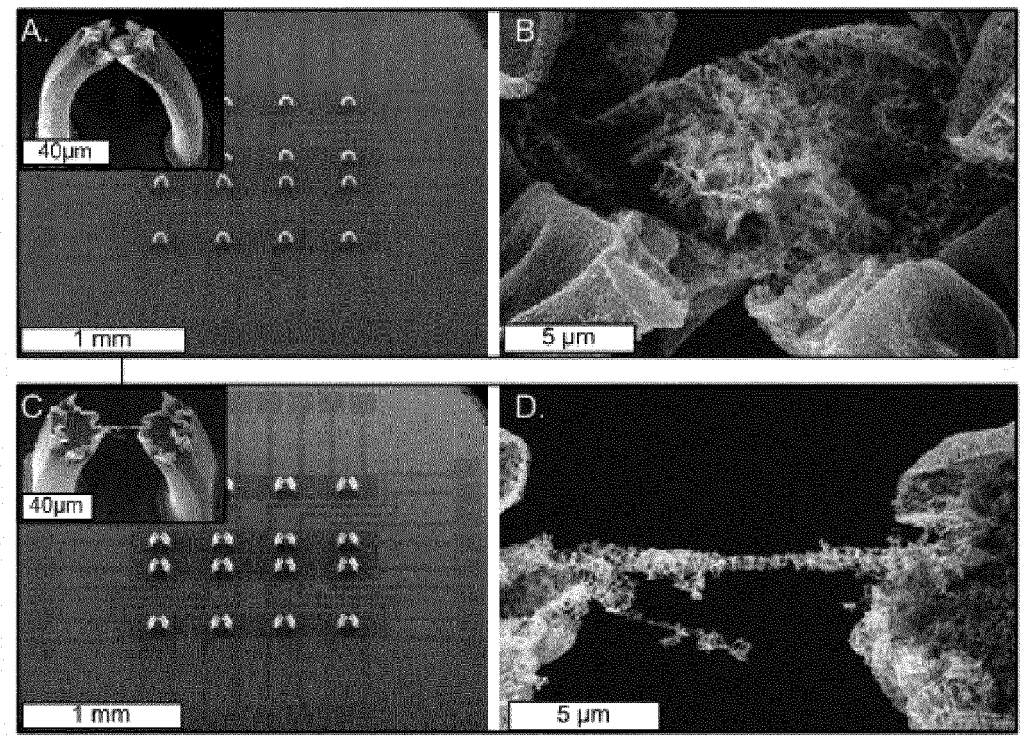
FIG. 9 (A-B) shows SEM images of arch-shaped sensing node arrays (C-D) SEM images of suspended-wire sensing node arrays.

FIG. 9. (A-B) SEM images of arch-shaped sensing node arrays (C-D) SEM images of suspended-wire sensing node arrays. This third level of hierarchy further increases the surface area of the sensors, and could further facilitate chemical functionalisation of the structures. Additional levels of hierarchy can be obtained by subsequently repeating coating steps. This process is applicable to all structures described in the first, second and third aspect of the disclosure.

Furthermore the use of the pyrolysed carbon nano and microstructures is disclosed. The pyrolysed carbon nano and microstructures of the present disclosure are in particular interesting in applications requiring electrochemical stability and/or bio-compatibility and/or electrical conductivity and/or thermal conductivity, and/or chemical functionalization, and/or a large surface to volume ratio. These include but are not restricted to chemical and biological probes, chemical- bio- and gas sensors, super capacitors, fuel cells, battery electrodes, and heat exchangers.

It is to be understood that although preferred embodiments, specific constructions and configurations, as well as materials, have been discussed herein for devices according to the present disclosure, various changes or modifications in form and detail may be made without departing from the scope of this disclosure as defined by the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Particular and preferred aspects are set out in the accompanying independent and dependent claims. Features from the dependent claims may be combined with features of the independent claims and with features of other dependent claims as appropriate and not merely as explicitly set out in the claims.

EXAMPLE

Figure 3:
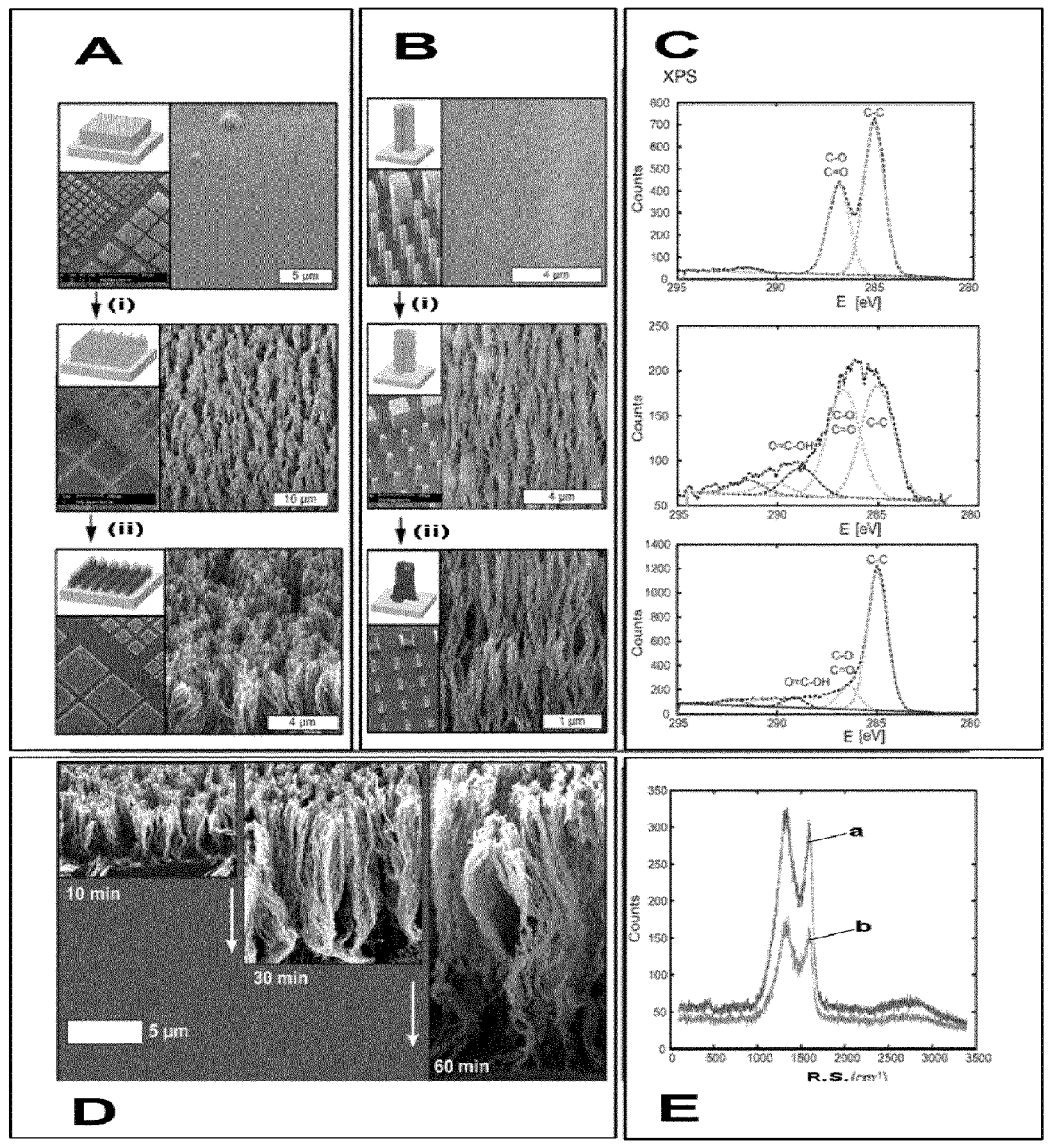
FIG. 3A illustrates SEM images of the top surface (top view) obtained after performing the main process steps (being photoresist patterning (result shown in the top picture), plasma treatment (i) and pyrolysis (ii)) corresponding to FIGS. 1A-1C.
FIG. 3B illustrates SEM images of the sidewalls (side view) obtained after performing the main process steps (being photoresist patterning (result shown in the top picture), plasma treatment (i) and pyrolysis (ii)) corresponding to FIGS. 1A-1C.
FIG. 3C illustrates XPS data for the different structures obtained after performing the main process steps (being photoresist patterning (top picture), plasma treatment (middle picture) and pyrolysis (bottom picture)) corresponding to FIGS. 1A-1C. The x-axis correspond to the binding energy.
FIG. 3D illustrates the effect of different plasma exposure times (identical pyrolysis conditions) involved in the fabrication of amorphous carbon nanostructures according to embodiments of the disclosure. This demonstrate nanofibre evolution as plasma etching time is increased.
FIG. 3E illustrates results obtained after performing Raman Spectroscopy on a bulk (non-treated) photoresist layer (SU8®) (curve a) and on fabricated amorphous carbon nanostructures (after performing photoresist patterning, plasma treatment and pyrolysis) (curve b) according to embodiments of the disclosure. The x-axis corresponds to raman shifts.
Figure 4:
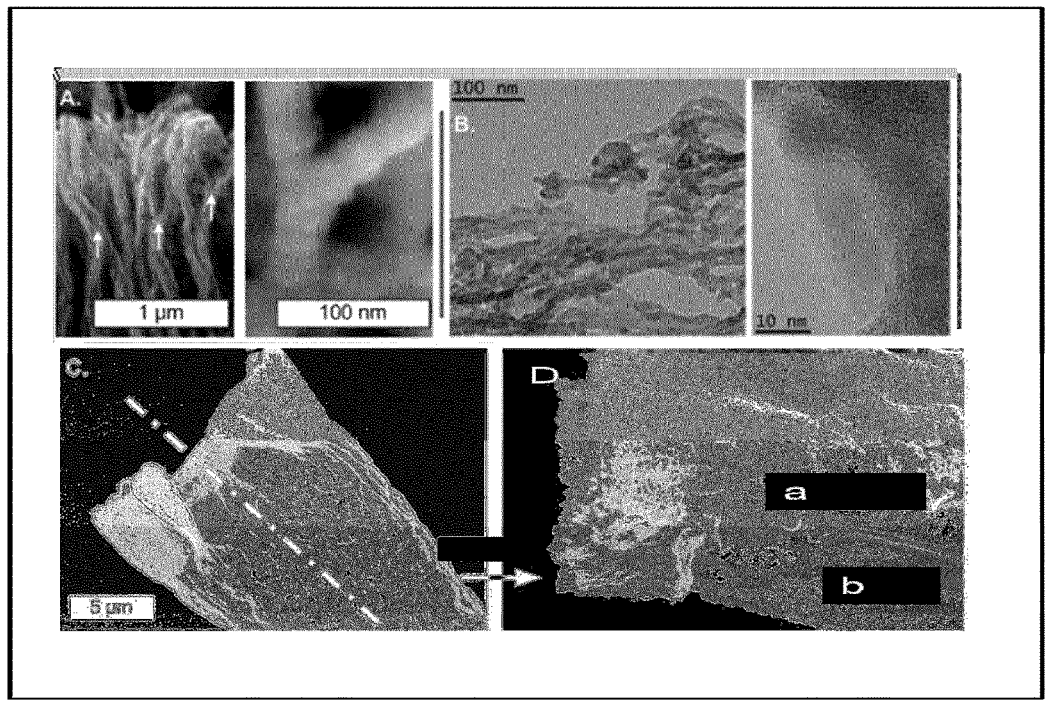
FIG. 4A illustrates SEM images of the pyrolysed (amorphous) carbon nanostructures according to embodiments of the present disclosure, showing for instance the Y-junctions in the nanowires.
FIG. 4B illustrates TEM images of the pyrolysed (amorphous) carbon nanostructures according to embodiments of the present disclosure.
FIG. 4C-D illustrate a cross section view of a hierarchical carbon pillar in detail. Nanowires (a) and a solid core (b) are indicated.

The CNW fabrication process began by the patterning of su-8® microstructures by standard UV photolithography (FIG. 3A top). Su-8 is a negative photoresist that is commonly used to fabricate high aspect ratio microstructures, and does not reflow during pyrolysis. Next, the sample was exposed to a harsh $O_2$ plasma treatment (5-60 min, 300 w, 200 sccm $O_2$, 150 mtorr in an 8" tempress ml 200 plasma etcher), which establishes the anisotropic nanowire texture of the su-8 (see FIG. 3A middle). Without behind bond by theory, we believe different mechanisms enabling the formation of su8 nanowires are possible. First, su8® photoresist contains antimony, which is accumulated at the surface upon plasma etching, and can reach up to 19% of the surface composition of our samples after plasma treatment as observed through xps (x-ray photoelectron spectroscopy) analysis (see table 1). Antimony, together with small amounts of aluminum that are sputtered from the plasma chamber can locally mask the su8 film and thereby induce the formation of nanowires. This masking effect, combined with the directionality of the plasma treatment induces a vertically oriented texture to the su-8 during plasma treatment, as shown in FIG. 3. Further, su-8 mainly comprises bisphenol a-epichlorohydrin-formaldehyde copolymer (an epoxy/phenolic resin). Therefore, the nanowire formation could be enhanced due to differences in etch rates between aromatic and linear parts of the polymer chain, similar to surface roughening observed in peek (polyether ether ketone) as well as pet (polyethylene terephthalate) during plasma etching.

Interestingly, we found that these nanofilaments are maintained during pyrolysis, resulting in "forests" of vertically aligned carbon nanofibres (FIG. 1c). Pyrolysis was performed by heating the samples in a nitrogen environment to 300° c. (40 min ramp followed by 30 min hold) and subsequently to 900° c. (90 min ramp followed by 60 min hold) followed by a slow cooling down to room temperature (at least 12 hours), similar to the process reported for carbon mems (microelectromechanical systems) [Schueller, O. J. A., S. T. Brittain, and G. M. Whitesides, Sensors and Actuators a-Physical, 1999. 72(2): p. 125-139.; Wang, C. L., et al., Journal of Microelectromechanical Systems, 2005. 14(2): p. 348-358; Du, R. B., et al., Small, 2009. 5(10): p. 1162-1168.; Teixidor, G. T., et al., Biomedical Materials, 2008. 3(3).; Sharma, C. S., A. Sharma, and M. Madou, Langmuir. 26(4): p. 2218-2222.; Schueller, O. J. A., S. T. Brittain, and G. M. Whitesides, Advanced Materials, 1997. 9(6): p. 477]. During this process, all volatile components evaporated from the su-8, causing a shrinkage of the su-8 nanofibres. The fibres were initially approximately 100 nm in diameter, and only 15-30 nm after pyrolysis. Xps data showed a great reduction in oxygen groups formed by the plasma treatment during pyrolysis, and interestingly, no traces of antimony were detected after pyrolysis (see table 1). The height over which the nanowires span can be simply controlled by the initial thickness of the su8 layer and the parameters of the oxygen plasma treatment, for instance, longer plasma treatment allows etching through thicker su8 structures. We found typical "forest" heights of 6 μm after 10 min, 13 μm after 30 min, and 27 μm after 60 min plasma treatment, as shown in FIG. 3D.

The invention claimed is:

1. A method comprising:
   providing a substrate;
   providing a polymeric material on the substrate, the polymeric material comprising one or more of:
   (a) at least one compound including a first part and a second part, wherein the first part allows a first etch rate and the second part allows a second etch rate, and wherein the first etch rate and the second etch rate are different plasma etch rates; or
   (b) at least one compound that is configured to mask an etching process;
   subjecting the polymeric material to a plasma etching process to form polymeric nanostructures defined by the etched polymeric material; and
   pyrolysing the polymeric nanostructures to form pyrolysed carbon nanostructures.

2. The method of claim 1, further comprising controlling a height of the pyrolized carbon nanostructures such that a solid carbon core structure having carbon nanostructure on top of the solid carbon core structure is fabricated.

3. The method of claim 1, further comprising providing an additional level of nanostructures on top of the pyrolysed carbon nanostructures by using a nanostructure fabrication method.

4. The method of claim 1, further comprising controlling a depth of the pyrolysed carbon nanostructures to create hierarchical carbon structures combining bulk and nanostructured carbon.

5. The method of claim 1, further comprising patterning the polymeric material to create three-dimensional carbon micro structures, wherein the three-dimensional carbon micro structures include the pyrolysed carbon nanostructures.

6. The method of claim 1, wherein the pyrolysed carbon nanostructures are nanowires.

7. The method of claim 1, wherein the pyrolysed carbon nanostructures are amorphous or graphitic.

8. The method of claim 1, wherein the pyrolysed carbon nanostructures are vertically aligned.

9. The method of claim 1, wherein the first part is a linear part of the polymeric material, and the second part is an aromatic part of the polymeric material.

10. The method of claim 1, wherein the etching process includes a plasma etching time sufficient to form the polymeric nanostructures, wherein the plasma etching time is from one to sixty minutes, and wherein the etching process is performed without using a separate mask.

11. The method of claim 10, wherein the plasma etching time is adapted to a height desired for the polymeric nanostructures.

12. The method of claim 1, further comprising patterning the polymeric material into a first polymeric structure prior to subjecting the polymeric material to the etching process.

13. The method of claim 12, further comprising repeating the steps of providing the polymeric material and patterning the polymeric material into the polymeric structure in order to form a second polymeric structure onto the first polymeric structure.

14. The method of claim 1, wherein the polymeric material includes the at least one compound including the first part and the second part, and the at least one compound that is configured to mask an etching process, and wherein the at least one compound that is configured to mask an etching process is a microparticle or nanoparticle.

15. The method of claim 14, wherein the microparticle or nanoparticle is selected from the group consisting of metallic and ceramic.

16. A method comprising:
providing a substrate;
forming a pattern on the substrate, wherein the pattern includes separated microstructures, wherein the microstructures comprise a polymeric material, wherein the polymeric material comprises
at least one compound including a first polymer group and a second polymer group, wherein the first polymer group has a first etch rate and the second polymer group has a second etch rate, and wherein the first etch rate and the second etch rate are different etch rates
depositing a polymer layer over the microstructures, wherein the polymer layer spans over adjacent microstructures;
subjecting the polymeric material and the polymer layer to an etching process to form polymeric nanostructures without the use of a separate mask; and
pyrolysing the polymeric nanostructures to form pyrolysed carbon nanostructures.

17. The method of claim 16, wherein the first polymer group is a linear part of the polymeric material, and the second polymer group is an aromatic part of the polymeric material.

18. The method of claim 16, wherein the etching process is a plasma etching process, and the etch rates are plasma etch rates.

* * * * *